United States Patent
Katkar et al.

(10) Patent No.: US 12,477,738 B2
(45) Date of Patent: *Nov. 18, 2025

(54) 3D NAND-HIGH ASPECT RATIO STRINGS AND CHANNELS

(71) Applicant: Adeia Semiconductor Inc., San Jose, CA (US)

(72) Inventors: Rajesh Katkar, San Jose, CA (US); Xu Chang, San Jose, CA (US); Belgacem Haba, Saratoga, CA (US)

(73) Assignee: Adeia Semiconductor Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/738,438

(22) Filed: Jun. 10, 2024

(65) Prior Publication Data

US 2025/0048633 A1    Feb. 6, 2025

Related U.S. Application Data

(63) Continuation of application No. 17/851,943, filed on Jun. 28, 2022, now Pat. No. 12,035,529, which is a (Continued)

(51) Int. Cl.
*H10B 43/27* (2023.01)
*H10B 41/27* (2023.01)
(Continued)

(52) U.S. Cl.
CPC .............. *H10B 43/27* (2023.02); *H10B 41/27* (2023.02); *H10B 41/35* (2023.02); *H10B 43/35* (2023.02)

(58) Field of Classification Search
CPC ........ H10B 43/27; H10B 41/27; H10B 41/35; H10B 43/35; H10B 41/50; H10B 43/50;
(Continued)

(56) References Cited

U.S. PATENT DOCUMENTS 8,445,347 B2    5/2013    Alsmeier
9,698,153 B2    7/2017    Liu et al.
(Continued)

FOREIGN PATENT DOCUMENTS

CN    101834152 A    9/2010
CN    102341907 A    2/2012
(Continued)

OTHER PUBLICATIONS

'232-Layer NAND' downloaded from URL< https://www.micron.com/products/nand-flash/232-layer-nand#:?:text=Micron%20extends%20NAND%20leadership%20with,%2C%20higher%2Dcapacity%20storage%20solutions.> on Aug. 16, 2023 (Year: 2023).
(Continued)

*Primary Examiner* — J. E. Schoenholtz
(74) *Attorney, Agent, or Firm* — HALEY GUILIANO LLP

(57) ABSTRACT

Aspects of the disclosure relate to forming a completed stack of layers. Forming the completed stack of layers may include forming a first stack of layers on a first substrate and forming a second stack of layers on a second substrate. The first stack of layers may be bonded to the second stack of layers. The first or second substrate may be removed. Prior to bonding the first stack of layers and the second stack of layer, one or more holes may be etched in the first stack of layers. After removing the second substrate, one or more holes may be etched in the second stack of layers, wherein each of the one or more holes in the second stack of layers extend into a corresponding hole in the one or more holes in the first stack of layers.

20 Claims, 13 Drawing Sheets

Related U.S. Application Data continuation of application No. 17/026,569, filed on Sep. 21, 2020, now Pat. No. 11,404,439, which is a continuation of application No. 16/506,277, filed on Jul. 9, 2019, now Pat. No. 10,784,282.

(60) Provisional application No. 62/784,424, filed on Dec. 22, 2018.

(51) Int. Cl.
  *H10B 41/35* (2023.01)
  *H10B 43/35* (2023.01)

(58) Field of Classification Search
  CPC ... H01L 2221/6835; H01L 2221/68359; H01L 21/6835; H10D 88/00
  See application file for complete search history.

(56) References Cited

U.S. PATENT DOCUMENTS

| | | | |
|---|---|---|---|
| 10,600,763 B1 | 3/2020 | Xiao | |
| 10,600,781 B1 | 3/2020 | Xiao et al. | |
| 10,636,813 B1 | 4/2020 | Xiao | |
| 10,784,282 B2 * | 9/2020 | Katkar | H10B 41/35 |
| 10,886,140 B2 | 1/2021 | Jiang et al. | |
| 11,404,439 B2 | 8/2022 | Katkar et al. | |
| 12,035,529 B2 | 7/2024 | Katkar et al. | |
| 2006/0033110 A1 | 2/2006 | Alam et al. | |
| 2010/0264551 A1 | 10/2010 | Farooq et al. | |
| 2015/0021513 A1 | 1/2015 | Kim et al. | |
| 2016/0204117 A1 | 7/2016 | Liu et al. | |
| 2016/0322381 A1 | 11/2016 | Liu et al. | |
| 2017/0110473 A1 | 4/2017 | Lee | |
| 2017/0162592 A1 | 6/2017 | Nishikawa et al. | |
| 2018/0145087 A1 | 5/2018 | Kwon et al. | |
| 2018/0277497 A1 * | 9/2018 | Matsuo | H10D 88/00 |
| 2019/0067324 A1 * | 2/2019 | Zhang | H01L 21/77 |
| 2019/0252404 A1 | 8/2019 | Kaminaga | |
| 2019/0378853 A1 | 12/2019 | Xiao et al. | |
| 2020/0013791 A1 | 1/2020 | Or-Bach et al. | |
| 2020/0035505 A1 | 1/2020 | Jiang et al. | |
| 2020/0075627 A1 | 3/2020 | Ahn et al. | |
| 2020/0105735 A1 | 4/2020 | Park et al. | |
| 2020/0203368 A1 | 6/2020 | Katkar et al. | |
| 2020/0388626 A1 | 12/2020 | Baraskar et al. | |
| 2021/0074723 A1 | 3/2021 | Katkar et al. | |
| 2021/0175244 A1 * | 6/2021 | Shin | H10B 43/35 |
| 2022/0328521 A1 | 10/2022 | Katkar et al. | |

FOREIGN PATENT DOCUMENTS

| | | |
|---|---|---|
| CN | 106920772 A | 7/2017 |
| CN | 107464817 A | 12/2017 |
| WO | 2019/037541 A1 | 2/2019 |

OTHER PUBLICATIONS

Digital Storage Projections for 2022, Part 2, downloaded from URL< https://www.forbes.com/sites/tomcoughlin/2021/12/29/digital-storage-projections-for-2022-part-2/?sh=3b50fe4a4f58> on Aug. 16, 2023 (Year: 2023).

* cited by examiner

3D NAND-HIGH ASPECT RATIO STRINGS AND CHANNELS

CROSS-REFERENCE TO RELATED APPLICATIONS

The present application is a continuation of U.S. patent application Ser. No. 17/851,943, filed Jun. 28, 2022, which is a continuation of U.S. patent application Ser. No. 17/026,569, filed Sep. 21, 2020, now U.S. Pat. No. 11,404,439, which is a continuation of U.S. patent application Ser. No. 16/506,277 filed Jul. 9, 2019, now U.S. Pat. No. 10,784,282, which claims the benefit of the filing date of U.S. Provisional Patent Application No. 62/784,424 filed Dec. 22, 2018, the disclosures of which are hereby incorporated herein by reference.

BACKGROUND

NAND memory is a non-volatile storage technology. NAND memory provides large storage capacity with quick access times and low power usage within a robust package, making it commonplace in many modern electronic devices, such as solid-state hard drives, smart phones, flash drives, memory cards, computers, etc. The density of NAND memory, which is the number of memory cells found on a single die, defines the storage capacity for NAND memory.

To increase the density of NAND memory, three-dimensional (3D) NAND was developed. FIG. 1A shows a side, cutaway view of a 3D NAND memory 101. The 3D NAND memory 101 includes memory pyramid 102. Memory pyramid 102 includes alternating and uniform layers of silicon oxide 103A-103E and silicon nitride 105A-105D stacked on top of a substrate 110. The alternating layers of silicon nitride and silicon oxide may be referred to as a stack. Although FIG. 1 shows alternating layers of silicon nitride and silicon oxide, in other prior art designs alternating layers of silicon oxide and polysilicon (or some other conductive material) are used. The silicon nitride layers 105A-105D may be further processed, such as removed and replaced by tungsten or some other conductive material to form word lines. Stacks formed using alternating layers of silicon oxide and polysilicon do not typically need to replace the polysilicon layers with tungsten and instead use polysilicon as the word lines. For clarity, silicon nitride layers 105A-105D are shown in FIGS. 1A and 1B, although at the production stage shown in FIGS. 1A and 1B the silicon nitride layers would typically be replaced with tungsten (or some other conductive material).

The substrate 110 may be silicon or another material, such as glass. Although the stack forming a portion of pyramid 102 is shown as being formed using alternating layers of the combination of silicon oxide and silicon nitride, it may also be formed using other suitable dielectric materials including but not limited to polysilicon, silicon oxynitride, silicon carbonitride, etc. FIG. 1A illustrates an example 3D NAND memory 101 having a particular overall structure. Other 3D NAND memory may have different structures, but all 3D NAND structures described herein will have a stack formed using alternating layers of materials as described herein.

To create the uniform silicon oxide and silicon nitride (or polysilicon) layers, and production of memory pyramids, such as memory pyramid 102, and the eventual 3D NAND memory 101, may require tight uniformity & defect control within the layers, minimum in-plane displacement and nitride shrinkage, minimal amount of wafer bowing after thermal stress is applied, and high nitride and oxide wet etch selectivity for patterning accuracy and electrical performance. In this regard, as the number of layers in the stack increases, such as to more than 64, the chance for defects within the layers increases, as the defect may propagate through the stack and compounded yield may be adversely affected.

FIG. 2 illustrates the propagation and expansion of a typical defect encountered during the production of a memory stack 201 by alternately layering silicon oxide and silicon nitride layers on a substrate 210. In this regard, the initial defect 215 occurs in the formation of silicon nitride layer 205A formed on silicon nitride layer 203A. The defect 215 results in a larger defect 225 in silicon oxide layer 203B formed on silicon nitride layer 205A. The size of the defect increases in each subsequent layer, such as shown with defects 235-255 in layers 205B, 203C, and 205C, respectively. Defects, like defect 215, may reduce yield as it propagates through the subsequent layers, such as layers 203B-203D and 205B-205C, magnify stress within the memory stack such as through warping or bowing, and increase production complexity and management.

Referring again to FIG. 1A, channels, such as channels 121A-121D, are formed through the layers of the stack. Although not shown, the pyramid 102 may be surrounded by an oxide in which the channels 121A-121D are also formed. The bit line contacts 125A-125D at the top of the channels may be formed with a conductive material, such as tungsten. Memory cells may be formed at the location of each intersection of a channel with a layer of tungsten (or other conductive material) which replaced the silicon nitride layers (e.g., 105A-105D). For example, memory cells may be found at locations 123A-123D, which correspond with the locations where channel 121D intersects with what were formally nitride layers 105A-105D, respectively, but have been replaced with tungsten. For clarity, only the location of memory cells formed in channel 121D are labeled. The holes at the locations 133A-133D formed at the periphery of the pyramid 102 are typically filled with conductive material (e.g. tungsten) that act as word line contacts or may even be filled with oxide or other material to act as the support pillars during the process.

Each contact connects a string of memory cells to a bit line or word line. For instance, bit line contact 125D connects memory cells at locations 123A-123D, each on different word lines, with bit line 111D. Bit line contacts 125A-125C similarly connect strings of memory cells to bit lines 111A-111C. The word lines formed where nitride layers 105A-105D were removed and replaced with a conductive material, such as tungsten, are connected to word lines 135A-135D via additional word line contacts 133A-133D, respectively.

The bit lines are connected to multiple connectors. For instance, FIG. 1B illustrates a front, cutaway view of a portion of the memory pyramid 102 in 3D NAND memory 101. Slits, such as slits 235A-235C may be formed in the oxide and silicon nitride layers to separate the memory pyramid 102 into separate sections 210-216. A connector, including connectors 125A and 225A-225C, may connect the memory cells in each section to the same bit line, such as bit line 111A.

Forming the channels and slits within the stack is commonly done through etching. Etching may create holes (shown as channels 121A-121D) or slits (shown as slits 235A-25C) in FIGS. 1A and 1B, which have a depth to width aspect ratios which are typically less than 40:1. For instance, channel 121A may be formed via etching at a depth of 4-5 microns with a diameter of around 80-150 nm.

However, forming the channels and slits using typical etching through a large stack of silicon oxide and silicon nitride layers, such as 64 or more layers, is difficult and time consuming with current etching technologies. The existing etching technologies which are being used to etch the holes or channels in current 32-64 layer stacks may reach their physical limits as the number of layers increase to 96 layers, 128 layers or beyond. In this regard, a trillion or more holes may be required on a single substrate and consistently forming these holes may be difficult at such a small scale.

FIG. 3 illustrates some of the defects which may develop in the production of holes, such as holes 303-309, through a stack 302 using common etching technologies. For example, hole 303 has incomplete etching, where the etching process did not go through the entire stack 302. Hole 305 has variations in the diameter of the hole between portion of the hole at the top of the stack and the bottom of the stack. Hole 307 has twisting, which results in the hole not extending linearly through the entirety of the stack 302. Hole 309 has bowing, where a portion of the hole extends outward into the layers more than a desired distance. Such defects can lead to shorts, interference between neighboring memory strings, and other performance issues affecting the product yield Filling the holes formed by etching with conformal layers of silicon oxide, silicon nitride, silicon oxynitride, and polysilicon to form the memory channels as well as with conductive metal, such as tungsten to create word line contacts at the periphery of the pyramid, may also present several challenges, particularly when the depth of the hole is large, such as 64 or more layers of alternating silicon nitride and silicon oxide. In this regard, the narrow diameter of the holes may restrict the processing of the memory channels and the word line contacts affecting the performance and the yield. For instance, the flow of the conductive metal through the holes, which may result in under-filled holes or voids in the fill.

BRIEF SUMMARY

Aspects of the disclosure relate generally to 3D NAND memory and the formation of memory cell stacks. One aspect includes a method of forming a memory cell stack in 3D NAND memory. The method includes forming a first stack of layers on a first substrate, wherein at least one layer of the first stack of layers has a thickness of 50 nm or less, forming a second stack of layers on a second substrate, bonding the first stack of layers to the second stack of layers to form a bonded stack, and removing the first or second substrate. Prior to bonding the first stack of layers and the second stack of layers, one or more holes may be etched in the first stack of layers.

After removing the second substrate, one or more holes may be etched in the second stack of layers, wherein at least one of the one or more holes in the second stack of layers extend into a corresponding hole in the one or more holes in the first stack of layers to form respective one or more extended holes. At least one of the one or more extended holes may at least partially be filled with a conductive material. At least one of the one or more extended holes may be process to form memory cells. At least one of the one or more extended holes may be at least partially filled with a dielectric. At least one of the one or more holes in the first stack of layers may be at least partially filled with a conductive material. In some examples, at least one of the one or more holes in the first stack of layers may be processed to form memory cells. At least one of the one or more holes in the first stack of layers may be filled at least partially with a dielectric.

In some instances, after removing the second substrate, one or more holes may be etched in the second stack of layers, wherein at least one of the one or more holes in the second stack of layers aligns with a corresponding hole in at least one of the one or more holes in the first stack of layers. At least one of the one or more holes in the second stack of layers may be filled with the conductive material, processing at least one of the one or more holes in the second stack of layers to function as a stack of memory cells, and/or filling at least one of the one or more holes in the second stack of layers with a dielectric.

In some instances, prior to bonding the first stack of layers with the second stack of layers, one or more holes may be etched in the first stack of layers and the second stack of layers.

In some instances, prior to bonding the first stack of layers with the second stack of layers, at least one of the one or more holes in the second stack of layers and at least one of the one or more holes in the first stack of layers may be filled, at least partially, with a conductive material. In some instances, the bonding may include non-adhesive direct bonding.

In some examples, at least the portion of the first stack of layers and/or the second stack of layers may be formed from alternating individual layers of silicon nitride and silicon oxide. In some examples, the first stack of layers and the second stack of layers may each include 16 or more layers, wherein each layer may include one layer of silicon nitride and one layer of silicon oxide. In some examples, the first stack of layers and the second stack of layers may include alternating individual layers of silicon oxide and polysilicon. The first stack of layers and/or the second stack of layers may include silicon oxide, silicon nitride, silicon oxynitride, and/or silicon carbonitride. In some instances, the first substrate and/or the second substrate may be formed from silicon, glass, and/or quartz. In some examples, the first substrate and/or the second substrate may be a logic layer.

In some instances, bonding the first stack of layers with the second stack of layers may be done by bonding a face of a top layer of the first stack of layers positioned furthest from the first substrate with a face of a top layer of the second stack of layers positioned furthest from the second substrate. In some instances, the bonded stack may be bonded to a logic layer and/or a third substrate.

Another aspect of the disclosure includes a method of forming a memory cell stack in 3D NAND memory. The method includes forming a base stack of layers on a first substrate, etching one or more holes in the base stack of layers, depositing an additional stack of layers on the base stack of layers, and etching one or more holes in the additional stack of layers. In some instances, at least one of the one or more holes in the base stack of layers may align with at least one of the one or more holes in the additional stack of layers to form respective one or more extended holes. The first substrate may be a logic layer. In some instances, prior to forming the additional stack of layers, a buffer layer may be deposited to the base stack of layers and at least partially filling at least one of the one or more holes in the base stack of layers with a conductive material. Prior to forming the additional stack of layers, a buffer layer may be deposited to the base stack of layers and processing at least one of the one or more holes in the first stack of layers, wherein the processing includes forming memory cells. In some instances, prior to forming the additional stack of layers, a buffer layer may be deposited to the base stack of layers and at least partially filling at least one of the one or more holes in the first stack of layers with a dielectric. In some instances, the one or more holes in the base stack of layers and the one or more holes in the additional stack of layers may at least partially be filled with a conductive material.

Another aspect of the disclosure includes a method of forming a memory cell stack in 3D NAND memory including forming a stack of layers on a first substrate, etching a first set of holes in the stack of layers, such that one or more holes in the first set of holes penetrate partially into the stack of layers from a side of the stack opposite the first substrate, bonding a second substrate on the side of the stack opposite the first substrate, removing the first substrate, and etching a second set of holes in the stack of layers from a side of the stack opposite the second substrate, wherein at least one of the one or more holes in the second set of holes penetrates into the stack of layers, and aligns with at least one of the one or more holes in the first set of holes to form at least one extended hole. In some examples, the second substrate may be a logic layer. The bonding may be non-adhesive direct bonding. In some examples, at least one extended holes may be at least partially filled with a conductive material. The at least one extended hole may be filled with a dielectric.

In some instances, at least one extended holes may be processed to form memory cells. In some instances, the method may include bonding the stack of layers to a logic layer and/or a third substrate, and removing the second substrate. In some instances, prior to removing the first substrate, at least one of the holes in the first set of holes may be filled with a conductive material. In some instances, prior to removing the first substrate: at least one of the holes in the first set of holes may be process to form memory cells. In some instances, prior to removing the first substrate, at least one of the holes in the first set of holes may be filled with a dielectric.

Another aspect of the disclosure is directed to a memory cell stack for 3D NAND memory. The memory cell stack may include a stack of at least 16 layers, wherein one or more layers of the stack has a thickness of 50 nm or less, wherein the stack is formed from a first stack of layers bonded to a second stack of layers. In some instances the stack may be formed on a substrate. In some examples, the stack may be formed on a logic layer.

In some examples, the stack may include at least one hole, wherein the at least one hole extends through each layer. The at least one hole may be filled at least partially with a conductive material. The at least one hole may include at least one memory cell. The at least one hole may be filled at least partially with a dielectric.

In some instances, each layer in the stack of layers may be formed from alternating individual layers of silicon nitride and silicon oxide. In some examples, each layer in the stack of layers may be formed from alternating individual layers of silicon oxide and polysilicon. In some examples, the stack of layers may include silicon oxide, silicon nitride, silicon oxynitride, and/or silicon carbonitride. In some examples, wherein the substrate may be formed from silicon, glass, or quartz.

DETAILED DESCRIPTION

While the following disclosure provides a number of examples, it should be understood that the concepts and techniques are not limited to specific examples, but rather can be more broadly applied. For example, while the examples herein may refer to NAND memory, it should be understood that the technology described in such examples could also be applied to other devices, such as universal flash storage (UFS), solid state memory, Dynamic Random access memory (DRAM) or other such volatile or non-volatile memory.

As used herein, 3D NAND memory, which may also be called vertical NAND (V-NAND), may include two-dimensional arrays of memory cells, typically found in planar NAND ("2D NAND"), stacked in vertical layers on a die to form memory cell stacks, referred to as memory pyramids in three-dimensions. Although the term memory pyramid is used to describe the memory cell stacks, the memory cell stacks may be in other shapes, such as a staircase type shape, box shape, etc.

Methods which minimize or remove the potential defects and production issues encountered in forming 3D NAND with large stacks, such as stacks having 64 or 96 layers or more, including forming the large stacks and etching and filling holes in the large stacks, will now be discussed.

As used herein, sub-stacks, which may be bonded together or otherwise formed together to form a completed stack. The sub-stacks may be formed of uniform, alternating layers of material typically used in a memory pyramid, such as silicon oxide and silicon nitride, silicon oxide and polysilicon, or other such alternating layers of materials. A conventional 64 layer stack would comprise of 64 alternating layers of silicon oxide and silicon nitride each or 64 alternating layers of silicon oxide and polysilicon each. In other words, each layer in the stack includes one layer of silicon oxide and one layer of silicon nitride, or other such material. In other examples, a 64 layer stack may actually have more than 64 layers, e.g. 72 layers. In some instances, the individual layers of silicon oxide and silicon nitride may be the same or different thicknesses.

The number of layers in each sub-stack may be dependent upon the size of the completed stack. For instance, if a 96 layer stack is required, the sub-stacks may each be 48 layers or if a 64 layer stack is required the sub-stacks may each be 32 layers. In some instances, the sub-stacks may have different numbers of layers. The number of layers in sub-stack may not be roughly half the total number of layers in the stacks, but any other number. For example, a 64 layer stack may be formed using 2 sub-stacks of 48 layers and 16 layers or any suitable combination.

Figure 1A:
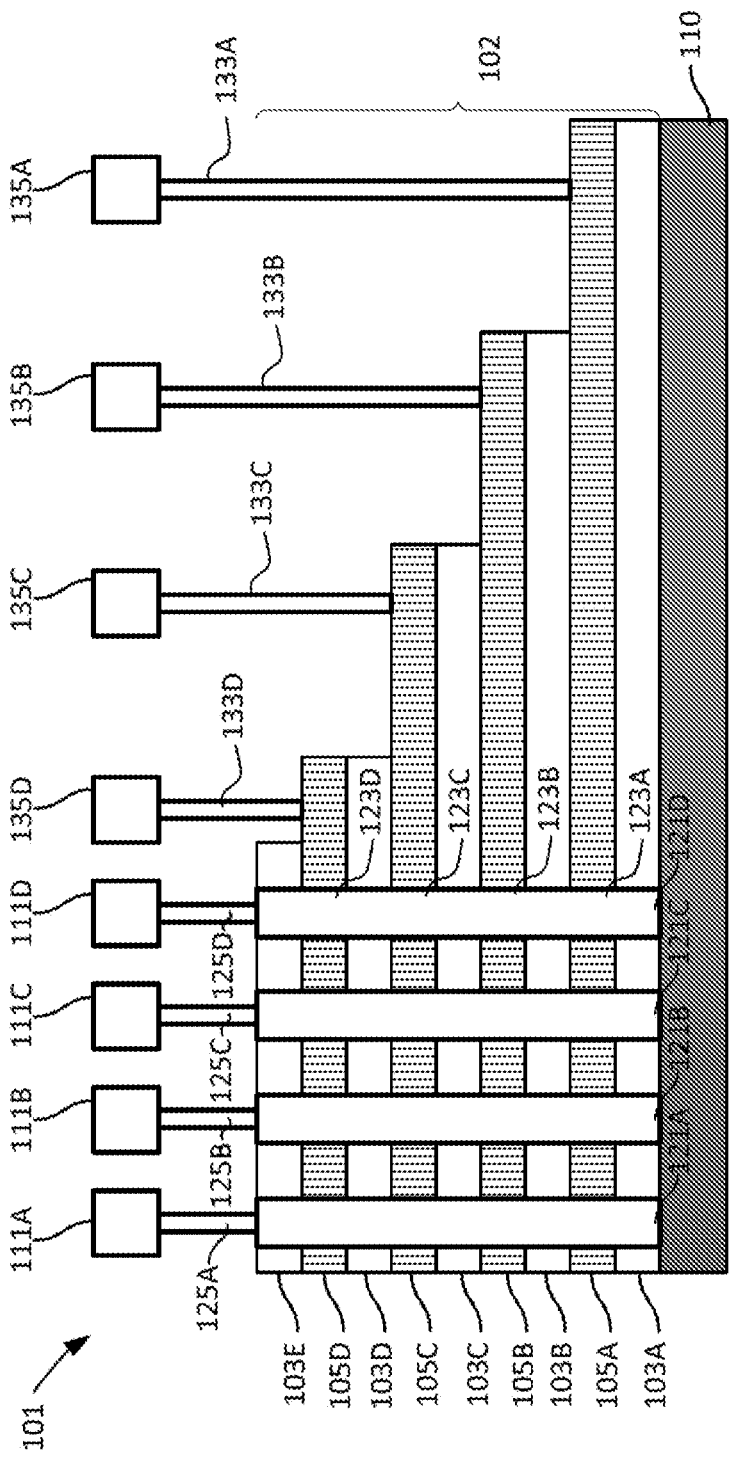
FIG. 1A shows a side cutaway view of a portion of a memory pyramid in a 3D NAND memory in the prior art.
Figure 1B:
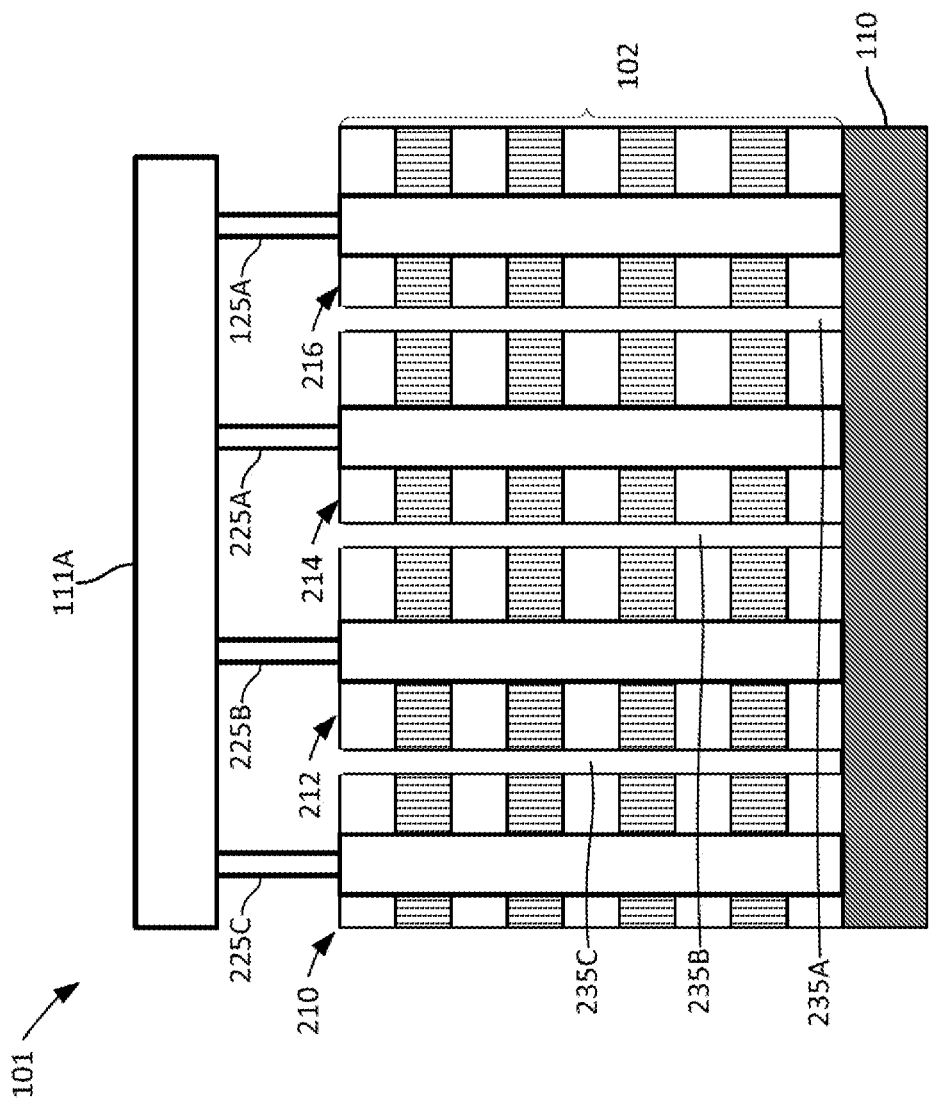
FIG. 1B shows a front, cutaway view of a portion of a memory pyramid in a 3D NAND memory in the prior art.
Figure 2:
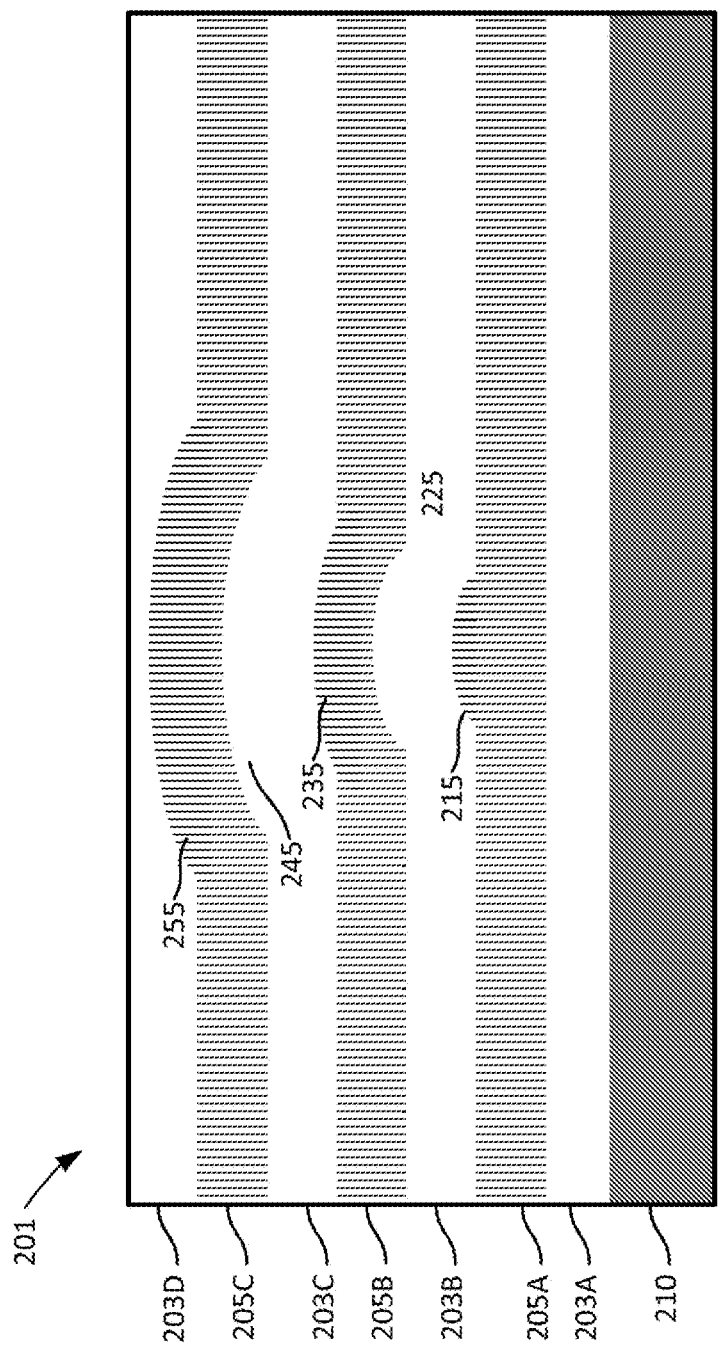
FIG. 2 illustrates a defect propagating through a stack in a memory pyramid in the prior art.
Figure 3:
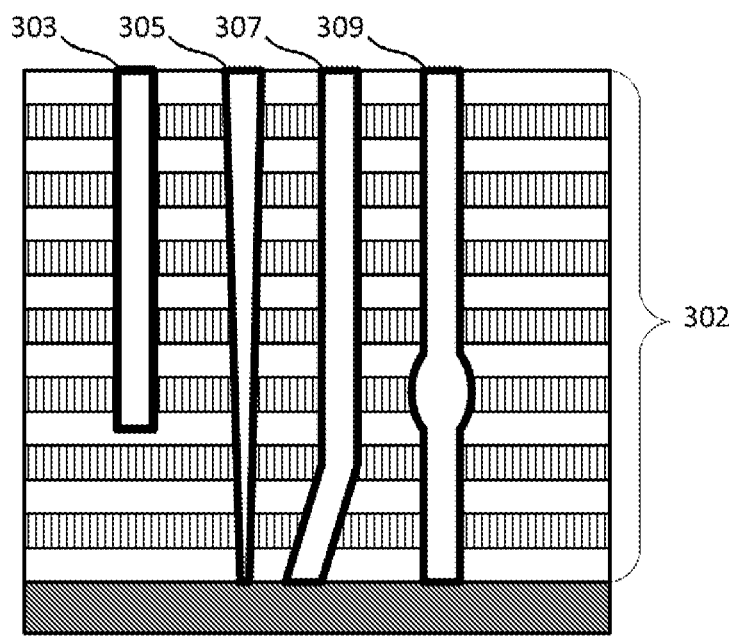
FIG. 3 illustrates defects in holes etched through a stack in the prior art.
Figure 4A:
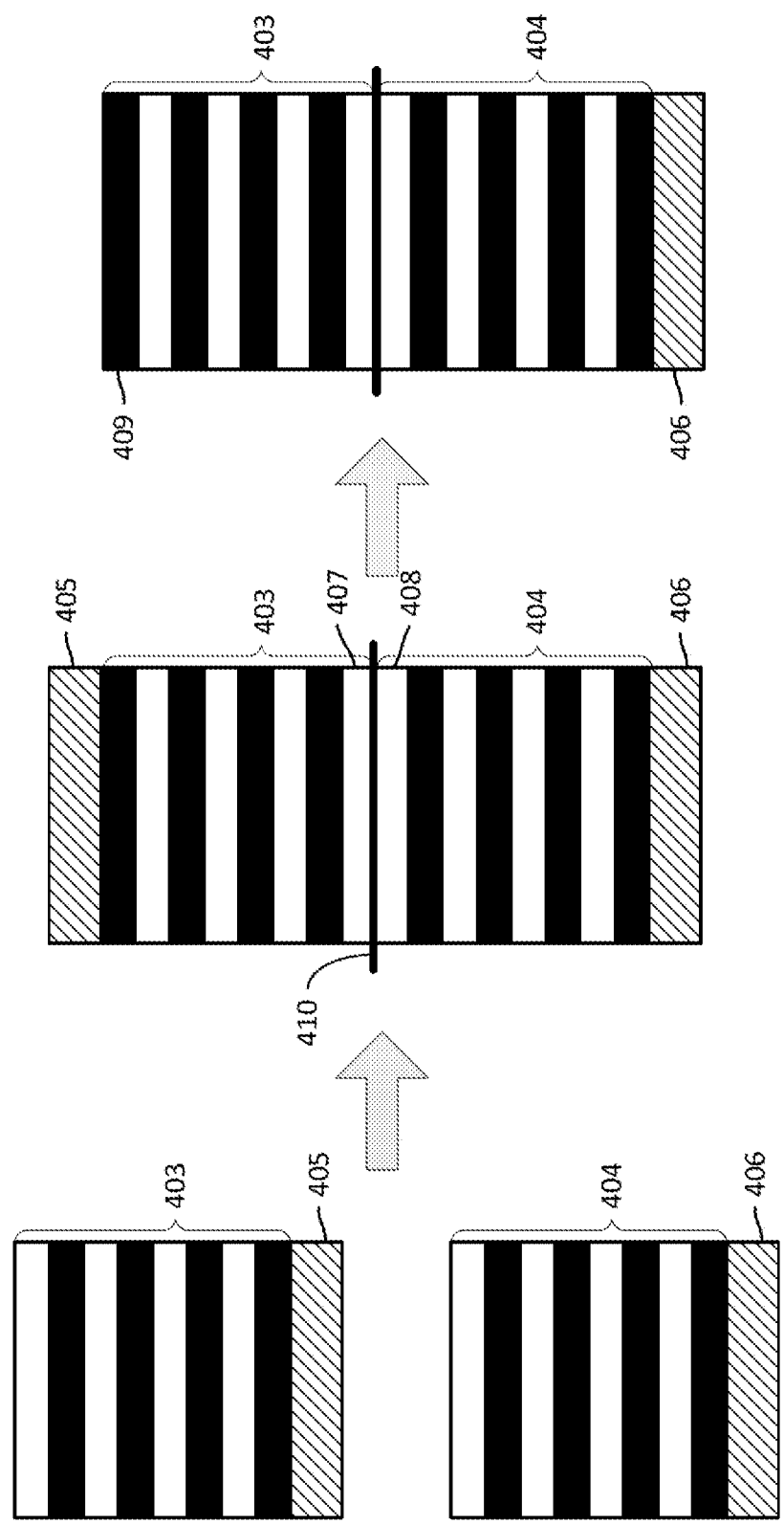
FIGS. 4A and 4B illustrate example sets of stages for increasing the layers of a stack in accordance with aspects of the disclosure.

As described herein, sub-stacks may be formed on carrier substrates. The carrier substrates may be formed from silicon, such as a single crystal silicon, polycrystalline silicon, amorphous silicon, or silicon-on-insulator (SOI) substrate. The carrier substrate may also be formed from other substrates, e.g. glass, quartz, etc. For example, FIG. 4A illustrates sub-stacks 403 and 404 formed on carrier substrates 405 and 406, respectively. In other examples, one or more buffer layers may be deposited on the substrate followed by the deposition of the dielectric layers to build the sub-stack.

Figure 5:
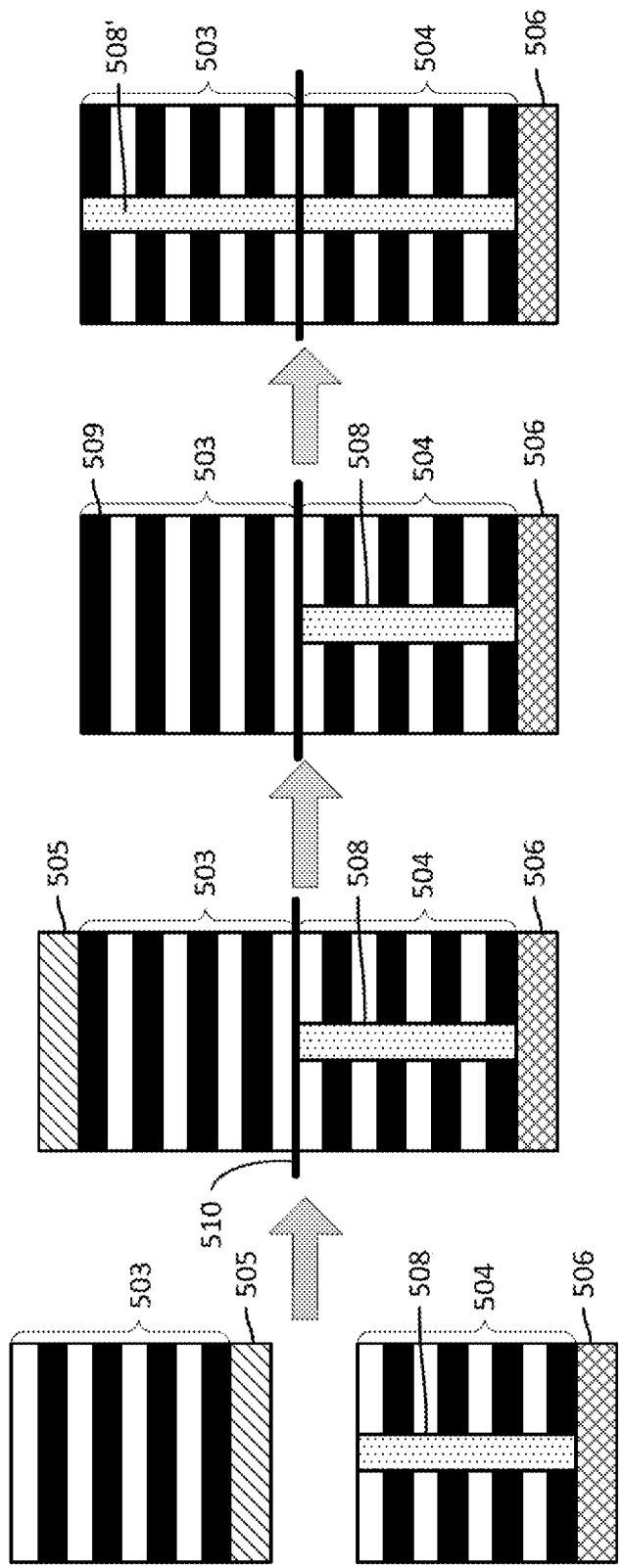
FIG. 5 illustrates an example set of stages for increasing the layers of a stack with etched holes in accordance with aspects of the disclosure.

In some instances, the sub-stacks may be formed on a logic layer in place of a dummy carrier substrate. A logic layer may include the components for handling the reading and writing of the 3D NAND memory cells formed within the memory pyramid, as well as the input and output (I/O) from the 3D NAND memory. In other words, the logic layer may control the 3D NAND memory's operation and communication with other components, such as processors. The logic layer is typically constructed as complementary metal-oxide-semiconductor (CMOS) circuits, which operate at low voltage. For instance, FIG. 5 shows sub-stack 504 formed on logic layer 506.

Bonding Sub-Stacks

A completed stack may be formed by stacking sub-stacks. In this regard, and as shown in FIG. 4A, sub-stacks 403 and 404 formed on carrier substrates 405 and 406, respectively. The sub-stacks 403, 404 may be bonded together. In this regard, and as further shown in FIG. 4A, sub-stack 403 and its carrier substrate 405 may be inverted and sub-stack 403 may be bonded, directly or indirectly, to sub-stack 404 at bonding interface 410 between silicon oxide layers 407 and 408. Bonding may occur at room temperature without the use of any adhesive. Although FIG. 4A shows a room temperature direct bonding between silicon oxide layer 407 with silicon oxide layer 408, bonding between layers may also be implemented, e.g. silicon nitride, polysilicon, silicon oxynitride, silicon carbonitride, etc. The bonding may be performed using any of a variety of processes. For example, the stacks may be bonded using various bonding techniques, including using room temperature direct dielectric to dielectric bonding using non-adhesive techniques, such as a ZiBond® direct bonding technique, or a DBI® hybrid bonding technique, both available from Invensas Bonding Technologies, Inc. (formerly Ziptronix, Inc.), a subsidiary of Xperi Corp. (see for example, U.S. Pat. Nos. 6,864,585 and 7,485,968, which are incorporated herein in their entirety).

The carrier substrate may be removed to expose the bonded stack formed by the bonded sub-stacks. For example, carrier substrate 405 is removed from the bonded sub-stacks to expose layer 409 found in sub-stack 403, as further shown in FIG. 4A. Although FIG. 4A illustrates silicon nitride to be the first layer deposited on either carriers 405 and 406, the first layer may also be silicon oxide, silicon nitride, silicon oxynitride, silicon carbonitride, polysilicon or any other dielectric layer. Although FIG. 4A illustrates the exposure of silicon nitride layer 409 after carrier substrate 405 was removed, the exposed layer could be silicon oxide, silicon nitride, silicon oxynitride, silicon carbonitride, polysilicon or any other layer deposited in the stack. The removal of the carrier substrate 405 may be done using, for example, chemical mechanical planarization ("CMP"), back grinding, etching, or the like. Although FIG. 4A illustrates carrier substrate 405 being removed, both carrier substrate 405 and carrier substrate 406 may be removed, or only carrier substrate 406 may be removed. In other examples, the final retained carrier, as shown by 406 in FIG. 4A may actually be a logic layer.

In some instances, one or more additional sub-stacks may be added to the bonded stack formed from bonded sub-stacks. For instance, a third sub-stack may be bonded to layer 409 of sub-stack 403 and a fourth sub-stack may be bonded to an exposed layer of the third-sub stack.

Figure 4B:
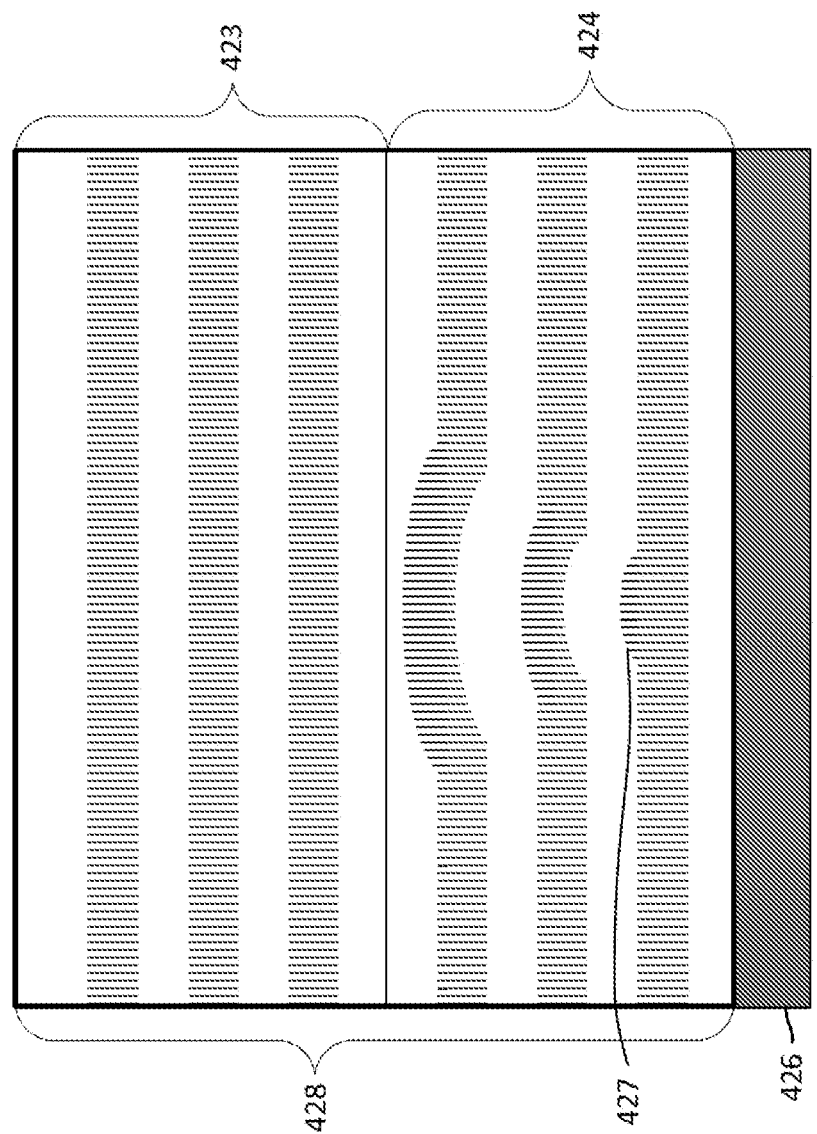

By bonding sub-stacks to form a larger stack, the chance for a defect to propagate through all layers of a completed stack is eliminated. For example, FIG. 4B illustrates a portion of sub-stack 424 having a defect 427 which propagates throughout the layers of the sub-stack. However, since the completed stack 428 is formed from two sub-stacks 423, 424, with each of the two sub-stacks being formed on separate carrier substrates, the defect 427 remains only within sub-stack 424 formed on substrate 426. In other words, the defect 427 does not propagate into sub-stack 423. As such, compound yield and productivity in producing memory pyramids may be increased. Since only a limited portion of a limited number of layers are affected by the defect, error correction code (ECC) in NAND devices may be able to easily overcome the defect affected memory cells and/or layers.

Bonding Sub-Stacks with Etched Holes

A completed stack having etched holes may be formed by stacking sub-stacks. For example, FIG. 5 shows a first sub-stack 503 formed on carrier substrate 505 and a second sub-stack 504 formed on a logic layer 506. Although second sub-stack 504 is shown in FIG. 5 as being formed on logic layer 506, the second sub-stack 504 may be formed on a carrier substrate. Similarly, first sub-stack 503 may be formed on a logic layer instead of carrier substrate 505.

The second sub-stack 504 may be etched using high aspect ratio (HAR) etching to form hole 508. HAR etching, such as plasma etching, may create holes having depth to width aspect ratios of less than 40:1, or more or less. For higher aspect ratio etch, the plasma etching technologies may reach their physical limits. Plasma etching often includes placing a photo mask, having openings where holes are to be formed, on top of the stack and applying a stream of plasma to the stack through the openings. The plasma applied to the stack through the openings creates holes in the stack. For example, a mask may be placed on second sub-stack 504, and a stream of plasma may form hole 508 at the location of an opening in the mask. Alternatively or in conjunction with plasma etching, other etching techniques may also be used to form hole 508, such as Bosch process, chemical wet etch, etc. The hole 508 in the second sub-stack 504 may be filled, at least partially, with a sacrificial material before bonding the first sub-stack 503 to sub-stack 504.

The sub-stacks 503, 504 may be bonded together. In this regard and as further shown in FIG. 5, first sub-stack 503 and its carrier substrate 505 may be inverted and first sub-stack 503 may be bonded to second sub-stack 504 at bonding interface 510. In some instances, the bonding may be done using room temperature direct bonding without the use of any adhesive. After bonding the first sub-stack 503 to the second sub-stack, the carrier substrate may be removed to expose the bonded stack formed by the bonded sub-stacks 503, 504. For example, carrier substrate 505 is removed from the bonded sub-stacks to expose layer 509 found in first sub-stack 503, as further shown in FIG. 5. In instances where the second sub-stack is formed on a carrier, both the carrier substrate 505 and carrier substrate of the second sub-stack 504 may be removed, or only the carrier substrate of the second sub-stack 504 may be removed.

Upon removing the carrier substrate 505, another hole 508' may be extended into the first sub-stack, in alignment with hole 508, by using HAR etching to form an extended hole. In this regard, the same mask used to make the hole 508 in second sub-stack 504 may be placed on the first sub-stack and a hole 508' in the first sub-stack 503 may be created directly above, and eventually joining hole 508 in the second sub-stack 504 to form an extended hole. Since the same mask may be used to perform the HAR etching, the hole formed in the first sub-stack 508' will be in alignment with the hole 508 formed in the second sub-stack 504. Depending on the number of layers in the first and second sub-stacks as well as the number of sub-stacks stacked, the aspect ratio of the hole may be doubled, tripled, quadrupled, or more or less.

Although not shown, one or more additional sub-stacks may be added to the bonded stack formed from previously bonded sub-stacks. For instance, an additional sub-stack formed on a carrier substrate may be bonded to exposed layer 509 of the first sub-stack. The carrier substrate from the additional sub-stack may be removed and the etching process may again occur to further extend the hole formed by holes 508 and 508'. This process may continue to add additional sub-stacks to the bonded stack formed from previously bonded sub-stacks. The holes 508, 508' in each sub-stack may be filled, at least partially, with sacrificial material before bonding to reduce contamination issues and/or add support.

After stacking all the sub-stacks, the sacrificial material in all the holes (i.e. one big aligned holed form from the individual holes in the sub-stacks) can be removed followed by further processes to fill the hole, at least partially, to eventually form the memory cells, herein referred to as processing. For instance, holes, such as holes which correspond to channels described herein, may then be conformally coated with a variety of materials to form the features including memory cells within the stack. In one of such processes, the channels may be conformally deposited with silicon oxide (inner blocking dielectric), silicon nitride (charge storage element), silicon oxynitride (tunneling dielectric layer), polysilicon layer (semiconductor channel layer that act as a body of memory string) and filled, at least partially, with silicon oxide (dielectric core isolation). These materials may be deposited within the holes via a combination of chemical vapor deposition (CVD), plasma enhanced chemical vapor deposition (PECVD), low pressure chemical vapor deposition (LPCVD), physical vapor deposition (PVD), atomic layer deposition (ALD) processes or any other suitable thin layer deposition process. These processed holes, which are filled, at least partially, may function as stacked memory cells in the finished 3D NAND memory, such as 3D NAND 201.

Bonding Sub-Stacks with Etched and Filled Holes

Figure 6:
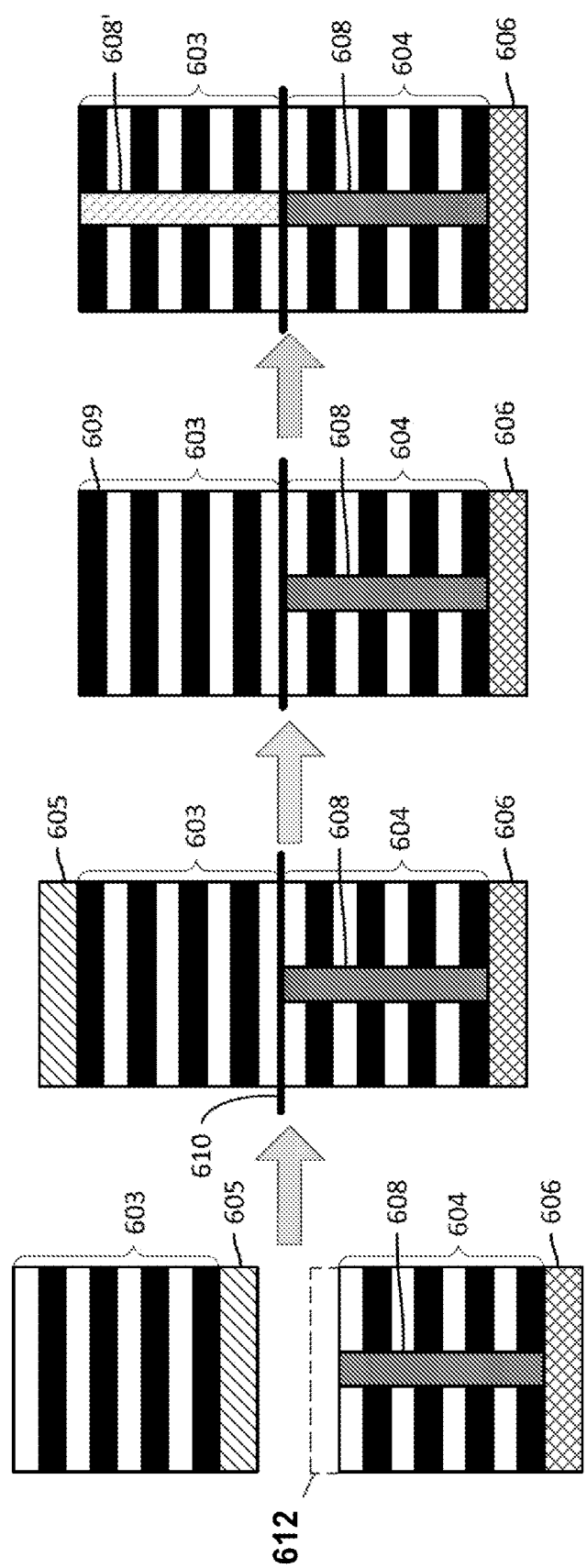
FIG. 6 illustrates an example set of stages for increasing the layers of a stack with etched and filled holes in accordance with aspects of the disclosure.

A completed stack having etched and, at least partially filled holes may be formed by stacking sub-stacks. For example, FIG. 6 shows a first sub-stack 603 formed on carrier substrate 605 and a second sub-stack 604 formed on a logic layer 606. Like in previous examples, although the second sub-stack 604 is shown in FIG. 6 as being formed on logic layer 606, the second sub-stack 604 may be formed on a carrier substrate. Similarly, first sub-stack 603 may be formed on a logic layer instead of carrier substrate 605.

The second sub-stack 604 may be etched using HAR etching to form a hole 608. The hole 608 may then be subjected to processing, as described herein. Some other holes not shown in FIG. 6, may be filled, at least partially, with a dielectric material, such as silicon oxide, which may act as a support pillar in the subsequent formation of the bonded stack. Other holes, also not shown here, may also be filled, at least partially, with a conductive material such as tungsten after formation of the bonded stack and the pyramid structure. The first sub-stack 603 (without any holes or channels) and second sub-stack 604 (with processed holes and channels) may be bonded together, such as with direct bonding at room temperature without the use of any adhesive. In this regard and as further shown in FIG. 6, first sub-stack 603 and its carrier substrate 605 may be inverted and first sub-stack 603 may be bonded to second sub-stack 604 at bonding interface 610. One or more transition layers or buffer layers 612 (shown in phantom) may need to be deposited on sub-stack 604 before bonding first sub-stack 703.

After bonding the first sub-stack 603 to the second sub-stack, the carrier substrate 605 may be removed to expose the bonded stack formed by the bonded sub-stacks 603, 604. For example, carrier substrate 605 is removed from the bonded sub-stacks to expose layer 609 found in first sub-stack 603, as further shown in FIG. 6. In instances where the second sub-stack is formed on a carrier, both the carrier substrate 605 and carrier substrate of the second sub-stack 604 may be removed, or only the carrier substrate of the second sub-stack 604 may be removed.

Upon removing the carrier substrate 605, a hole 608' may be formed in the first sub-stack 603, in alignment with the processed hole 608 of the second sub-stack, by using HAR etching. Hole 608' may then be processed as described herein to form stacked memory cells, support pillars, and/or conductive contacts. Depending on the number of layers in the first and second sub-stacks, the aspect ratio of the hole may be doubled, tripled, quadrupled, or more or less. Moreover, since the filling of the holes of the bonded stack formed by sub-stacks 603, 204 occurs in stages, and the total amount of layers in the sub-stacks which are filled are less than if a large stack was filled all at once. Accordingly, the risk of defects and voids forming during the processing of the hole is reduced.

Although not shown, one or more additional sub-stacks may be added to the bonded stack formed from previously bonded sub-stacks. For instance, an additional sub-stack formed on a carrier substrate may be bonded to exposed layer 609 of the first sub-stack. The carrier substrate from the additional sub-stack may be removed and the etching process may again occur to further extend the hole formed by 608, 608', followed by further processing the new hole in the additional sub-stack. This process may continue to add additional sub-stacks to the bonded stack formed from previously bonded sub-stacks.

Depositing Additional Sub-Stacks on a Base Sub-Stack

Figure 7:
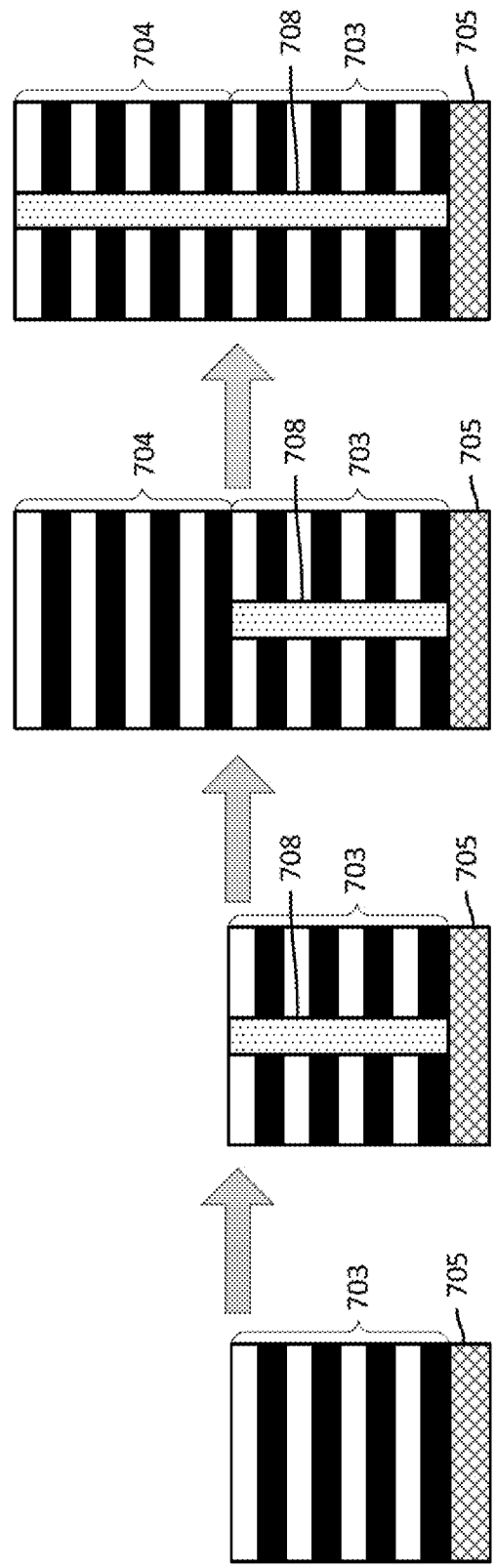
FIG. 7 illustrates another example set of stages for increasing the layers of a stack with etched holes in accordance with aspects of the disclosure.

A completed stack having etched holes may be formed by processing a first sub-stack and depositing more additional layers corresponding to a second sub-stack on the processed first sub-stack. For example, FIG. 7 shows a first sub-stack 703 formed on logic layer 705. Although the first sub-stack 703 is shown in FIG. 7 as being formed on logic layer 705, the base sub-stack 703 may be formed on a carrier substrate.

The base sub-stack 703 may be etched using HAR etching to form a hole 708. This hole 708 may be filled, at least partially, with a suitable sacrificial material. Additional layers, which form a second sub-stack 704 may then be deposited on the base sub-stack 703, such as by a thin layer deposition processes. One or more transition layers or buffer layers may need to be deposited on sub-stack 703 before layer deposition to form second sub-stack 704. Hole 708 may be extended into the second sub-stack by using HAR etching to form an extended hole. Depending on the number of layers in the base and second sub-stacks, the aspect ratio of the hole may be doubled, tripled, quadrupled, or more or less. The sacrificial material, if used, can then be removed and the holes then processed further as described herein to form stacked memory cells, support pillars, and/or conductive contacts.

Although not shown, the hole may be processed further (to form memory cells, support pillars, and/or conductive channels as described herein) after completion or at each stage. For instance, hole 708 in base sub-stack 703 may be processed, fully or partially, prior to the second sub-stack 704 being formed on the base sub-stack 703. Hole 708 may again be processed after the hole 708 is extended into the second sub-stack 704. As the processing of the hole 708 may occur in stages, the total amount of layers in the stacks which are filled, at least partially, in one stage are less than if a large stack was processed all at once. Accordingly, the risk of defects and voids forming in the fill is reduced.

Although not shown, one or more additional sub-stacks may be added to the bonded stack formed from previously bonded sub-stacks. For instance, an additional sub-stack may be bonded to the last layer formed in the second sub-stack 704 and the etching process may again occur to further extend the hole 708. This process may continue to add additional sub-stacks to the bonded stack formed from previously bonded sub-stacks.

Etching and Filling Sub-Stacks Individually

Figure 8:
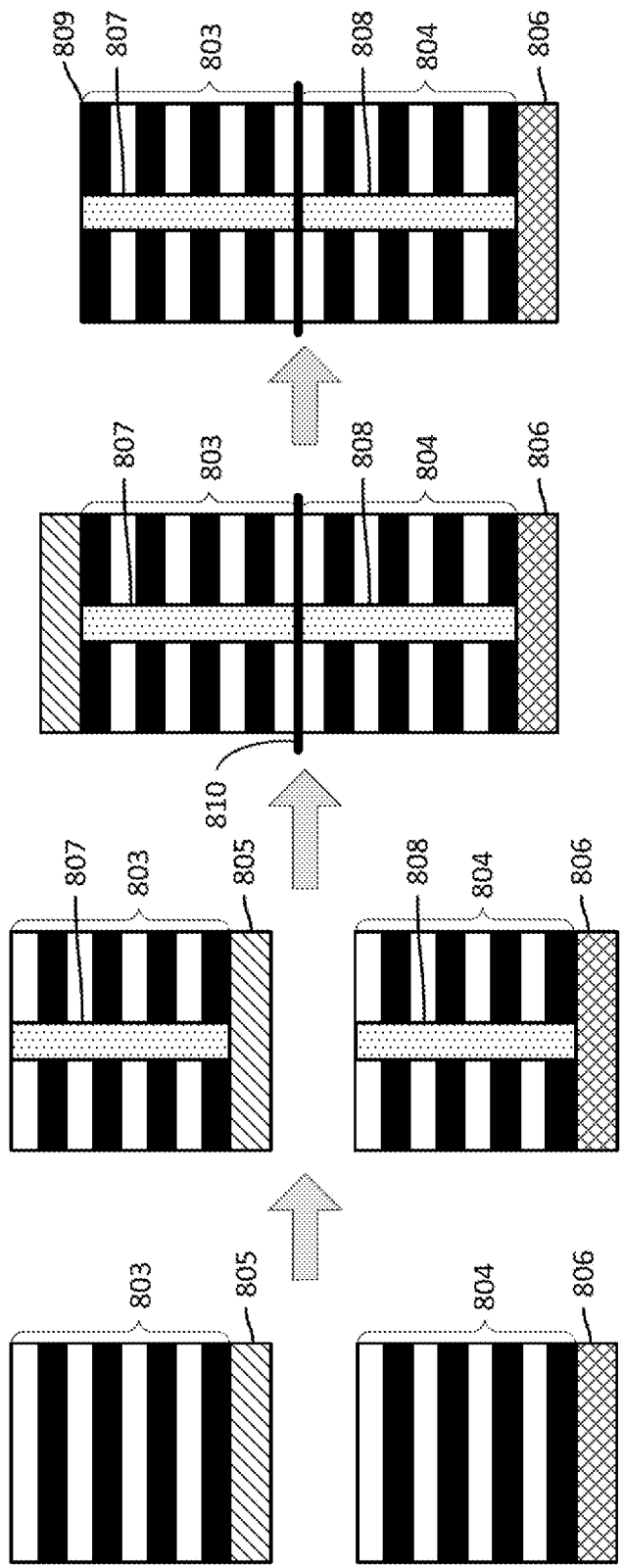
FIG. 8 illustrates another example set of stages for increasing the layers of a stack with etched holes in accordance with aspects of the disclosure.

A completed stack having etched holes may be formed by etching individual sub-stacks and bonding the etched sub-stacks together. For example, FIG. 8 shows a first sub-stack 803 formed on carrier substrate 805 and a second sub-stack 804 formed on a logic layer 806. Like in previous examples, although the second sub-stack 804 is shown in FIG. 8 as being formed on logic layer 806, the second sub-stack 804 may be formed on a carrier substrate. Similarly, first sub-stack 803 may be formed on a logic layer instead of carrier substrate 805.

The first and second sub-stacks 803, 804 may be etched using HAR etching. The HAR etching of the first sub-stack 803 may form a first hole 807 the HAR etching of the second sub-stack may form a second hole 808.

The sub-stacks 803, 804 may be bonded together. In this regard and as further shown in FIG. 8, first sub-stack 803 and its carrier substrate 805 may be inverted and first sub-stack 803 may be bonded to second sub-stack 804 at bonding interface 810. The holes 808 in sub-stack 804 and holes 807 in sub-stack 803 may filled, at least partially, with a sacrificial material prior to bonding. After bonding the first and second sub-stack, the carrier substrate may be removed to expose the bonded stack formed by the bonded sub-stacks. For example, carrier substrate 805 is removed from the sub-stack 803 to expose layer 809, as further shown in FIG. 8. The sacrificial material, if used, can then be removed and the holes then processed further as described herein to form stacked memory cells, support pillars and/or conductive contacts. In instances where the second sub-stack is formed on a carrier, both the carrier substrate 805 and carrier substrate of the second sub-stack 804 may be removed, or only the carrier substrate of the second sub-stack 804 may be removed.

Depending on the number of layers in the first and second sub-stacks, the aspect ratio of the hole formed by the combination of holes 807 and 808 may be doubled, tripled, quadrupled, or more or less, compared to individual holes 807 and 808.

Figure 9:
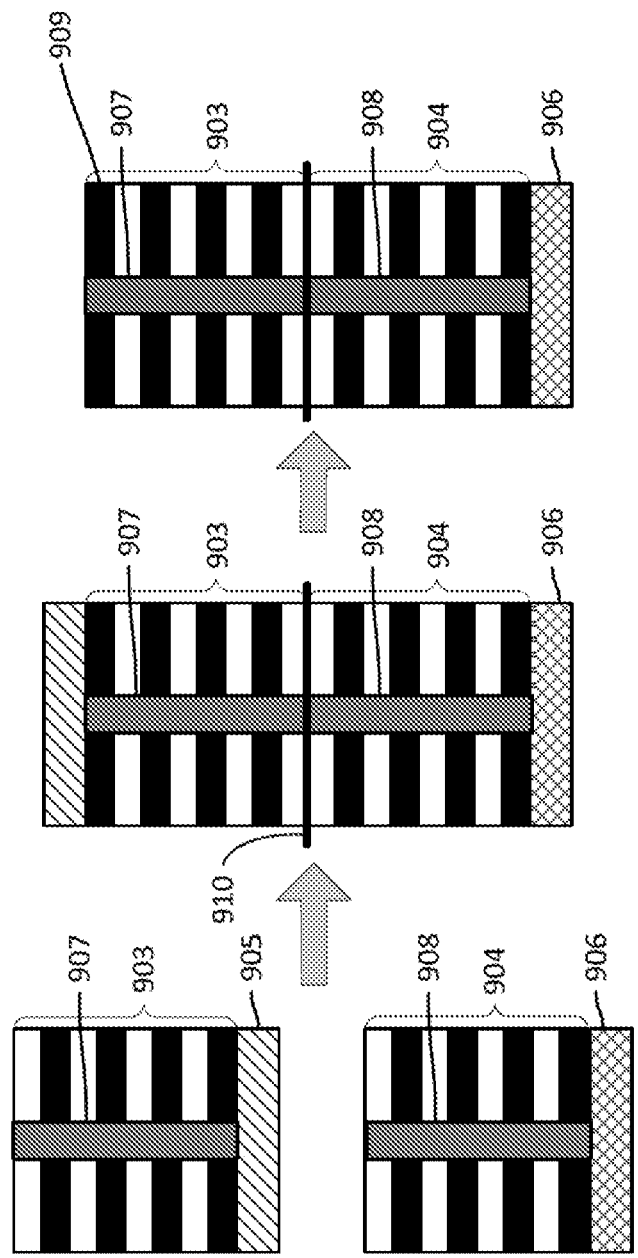
FIG. 9 illustrates another example set of stages for increasing the layers of a stack with etched and filled holes in accordance with aspects of the disclosure.

In some instances, holes may be filled, at least partially, with a conductive material, such as tungsten, prior to bonding. For example, and as shown in FIG. 9, holes 907 and 908 may be filled, at least partially, and subsequently bonded together at bonding interface 910. Bonding may be done using direct bond interconnect (DBI) hybrid bonding. After bonding the first sub-stack 903 to the second sub-stack 904, the carrier substrate 905 may be removed expose layer 909. Logic layer 906 may remain, as further shown in FIG. 9. Since the filling of the holes 907 and 908 occurs prior to bonding, the total amount of layers in the stacks which are filled are less than if the completed stack formed by the first and second sub-stacks was filled all at once. Accordingly, the risk of voids forming in the fill is reduced.

Although not shown, one or more additional sub-stacks may be added to the bonded stack formed from previously bonded sub-stacks shown in FIGS. 8 and 9. For instance, an additional sub-stack formed on a carrier substrate may be bonded to exposed layer 809 of the first sub-stack. The carrier substrate from the additional sub-stack may be removed and the etching, and in some instances, filling process may again occur to further extend and/or fill the hole formed by holes 807 and 808. This process may continue to add additional sub-stacks to the bonded stack formed from previously bonded sub-stacks.

Partial Etching and Filling of a Large Stack

Figure 10:
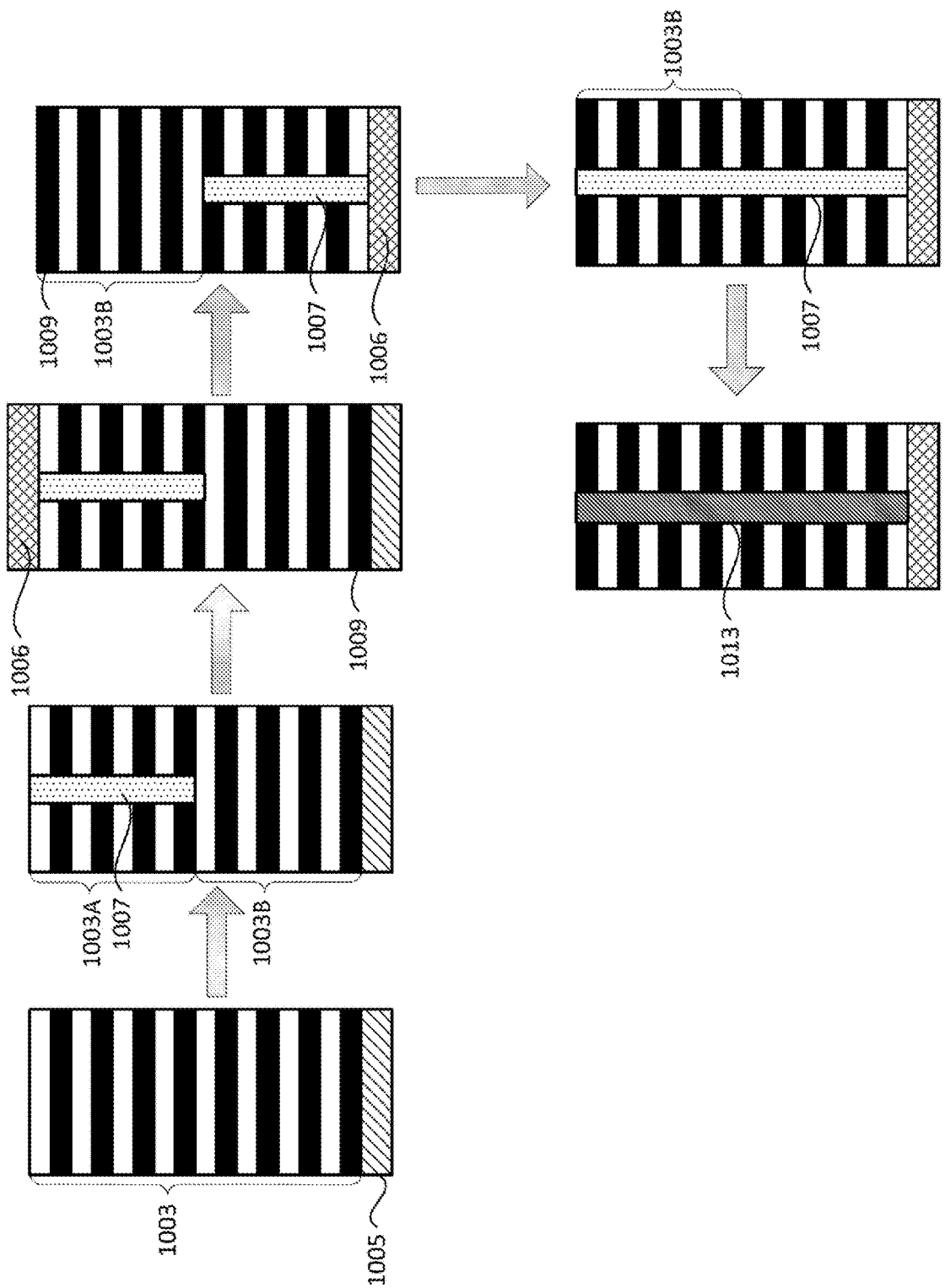
FIG. 10 illustrates an example set of stages for etching a stack in accordance with aspects of the disclosure.

A completed stack having etched holes may be formed by processing portions of the completed stack. For example, FIG. 10 shows a completed stack 1003 formed on carrier substrate 1005. The first half of the completed stack 1003A may be etched to form a hole 1007. Hole 1007 may be filled, at least partially, with a sacrificial material to reduce any contamination issues that may arise during subsequent direct bonding, described herein. A logic layer 1006 may be bonded to the first half of the completed stack 1003A, such as with room temperature direct bonding without the use of any adhesive. In some instances, layer 1006 may be another temporary carrier substrate and may be bonded by some temporary bonding mechanism.

After bonding the logic layer 1006 to the first half of the completed stack 1003A, the carrier substrate 1005 may be removed to expose layer 1009 of the second half of the completed stack 1003B, as further shown in FIG. 10. The second half of the completed stack 1003B may then be etched to extend hole 1007 from the first half to the second half of the completed stack. In other words, once hole 1007 is extended it forms an extended hole. The sacrificial material, if used, to fill the hole 1007 can then be removed. The entirety of hole 1007 is processed further as described herein to form stacked memory cells, support pillars, and/or conductive contacts as shown by 1013.

In some instances, holes 1007 are etched in more or less than the entirety of the first half of the completed stack 1003A prior to etching the extension of the holes in the second half of the completed stack 1003B. For instance, holes 1007 are etched in three-quarters of the completed stack prior to bonding the logic layer 1006 to the first half of the completed stack 1003A. The extension of the holes in the remainder of the completed stack may then be performed after the carrier substrate 1005 is removed.

Figure 11:
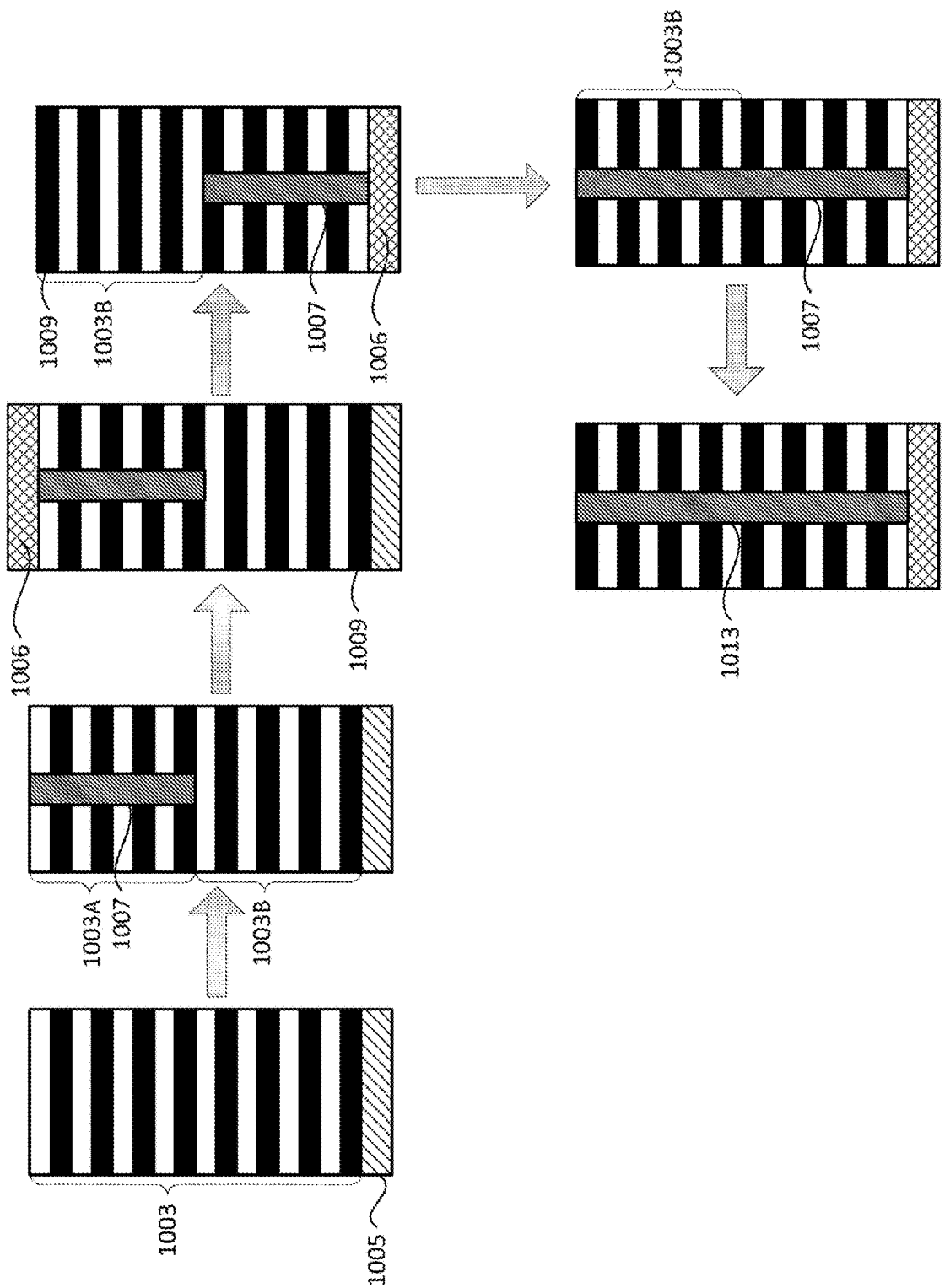
FIG. 11 illustrates an example set of stages for etching and filing a stack in accordance with aspects of the disclosure.

In another embodiment, layer 1006 may also be another temporary carrier and the final processed memory stack can be directly bonded to an actual logic wafer; the last carrier wafer 1006 is removed before further processing of the wafer. In this embodiment, memory stack is separately formed on a carrier wafer and then bonded to a separate logic wafer using wafer to wafer bonding process using DBI In some instances, hole 1007 may be processed further as described herein to form stacked memory cells, support pillars and/or conductive contacts, prior to extending the hole 1007 into the second half of the completed stack 1003B. For example, and as shown in FIG. 11, hole 1007 may be partially or fully processed prior to logic layer 1006 being placed or otherwise formed on the first half of the completed stack 1003A. In the example shown in FIG. 11, after bonding the logic layer 1006 to the first half of the completed stack 1003A, the carrier substrate 1005 may be removed to expose the second half of the completed stack 1003B. The second half of the completed stack 1003B may then be etched to extend hole 1007 from the first half to the second half of the completed stack. The remaining portion of the hole 1007 which extends into the second half of the completed stack may then be processed to form stacked memory cells, support pillars and/or conductive contacts.

In another embodiment, layer 1006 may also be another temporary carrier and the final processed memory stack can be directly bonded to an actual logic wafer; the last carrier wafer 1006 is removed before further processing of the wafer. In this embodiment, memory stack is separately formed on a carrier wafer and then bonded to a separate logic wafer using wafer to wafer bonding process using DBI.

As the filling of the hole 1007 may occur in stages, the total amount of layers in the stacks which are filled are less than if a large stack was filled all at once. Accordingly, the risk of defect or voids forming in the fill is reduced. Moreover, depending on the number of layers etched at a time, the aspect ratio of the hole formed by etching the completed stack 1003 may be double, triple, quadruple, or more or less, compared to if only one side of the stack 1003 was etched.

Although FIGS. 5-11 illustrate only a single hole 508 being formed on the sub-stacks, any number of holes may be formed, and in some instances filled, at least partially, on the sub-stacks and bonded sub-stacks, such as trillions or more or less within a wafer. Moreover, although the foregoing examples describe the formation of the holes using HAR etching using plasma etching techniques, other etching techniques may be used in conjunction with, or in place of HAR etching. It is understood that some of the holes may be processed to form memory stacks, some others may be processed to form pillar supports and others may be processed to form conductive contacts, all in separate process steps not described in detail here.

Unless stated otherwise, the foregoing alternative examples are not mutually exclusive. They may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. As an example, the preceding operations do not have to be performed in the precise order described above. Rather, various steps can be handled in a different order or simultaneously. Steps can also be omitted unless otherwise stated. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A method of forming a memory cell stack in 3D NAND memory, the method comprising:
    forming a first stack of layers on a first substrate;
    forming a second stack of layers on a second substrate;
    depositing a buffer layer on the first stack of layers;
    directly bonding the second stack of layers to the buffer layer on the first stack of layers to form the memory cell stack, wherein the second stack of layers is directly bonded to the buffer layer on the first stack of layers without using an intervening adhesive; and
    after bonding the second stack of layers to the buffer layer on the first stack of layers, removing at least a portion of the second substrate.

2. The method of claim 1, wherein removing at least the portion of the second substrate comprises using a backgrind process, a CMP process, or an etch process.

3. The method of claim 1, further comprising forming a hole in the second stack after bonding the second stack to the buffer layer on the first stack.

4. The method of claim 3, further comprising depositing a conductive material in the hole to form a contact.

5. The method of claim 3, further comprising depositing a plurality of conformal layers in the hole to at least partially form one or more memory cells of the memory cell stack.

6. The method of claim 1, further comprising:
    prior to bonding the second stack, forming a first hole in the first stack; and
    sequentially depositing a plurality of conformal layers in the first hole to at least partially form memory cells of the memory cell stack.

7. The method of claim 6, further comprising after bonding the second stack, forming a second hole in the second stack, the second hole being aligned with the first hole.

8. The method of claim 6, wherein at least partially forming memory cells further comprises: after sequentially depositing the plurality of conformal layers and prior to bonding the second stack, depositing silicon oxide in the first hole to form a dielectric core.

9. The method of claim 1, wherein the first stack and the second stack each comprise alternating layers of silicon nitride and silicon oxide.

10. The method of claim 9, wherein the first stack and the second stack each comprise at least 16 sets of the alternating layers.

11. The method of claim 1, wherein the first stack and the second stack each comprise alternating layers of silicon oxide and polysilicon.

12. The method of claim 1, wherein:
    the first stack and second stack each comprise a repeating sequence of layers, and
    the repeating sequence comprises a silicon oxide layer, a silicon nitride layer, a silicon oxynitride layer, a silicon carbonitride layer, or a combination thereof.

13. The method of claim 1, further comprising, prior to bonding the second stack to the buffer layer on the first stack, forming a first hole in the first stack.

14. The method of claim 13, further comprising forming a second hole in the second stack, wherein the second hole connects with the first hole to define an extended hole that extends vertically through the first and second stacks.

15. The method of claim 13, further comprising:
   forming a second hole in the second stack, wherein the second hole is aligned with the first hole; and
   depositing a conductive material in the aligned first and second holes to form a contact.

16. The method of claim 13, further comprising:
   forming a second hole in the second stack, wherein the second hole is aligned with the first hole; and
   depositing a dielectric material in the aligned first and second holes to form a support pillar.

17. The method of claim 13, further comprising, prior to bonding the second stack, forming a second hole in the second stack.

18. The method of claim 17, further comprising, prior to bonding the second stack to the buffer layer on the first stack, depositing a conductive material to at least partially fill each of the first and second holes.

19. A method of forming a memory cell stack in 3D NAND memory, the method comprising:
   forming a first stack of layers on a first substrate;
   forming a second stack of layers on a second substrate;
   prior to bonding the second stack of layers, forming a first hole in the first stack of layers;
   depositing a first plurality of conformal layers in the first hole to at least partially form the memory cell stack;
   bonding the second stack to the first stack to form the memory cell stack; and
   after bonding the second stack to the first stack:
      removing at least a portion of the second substrate;
      forming a second hole in the second stack, the second hole being aligned with the first hole; and
      depositing a second plurality of conformal layers in the second hole to at least partially form the memory cell stack.

20. A method of forming a memory cell stack in 3D NAND memory, the method comprising:
   forming a first stack of layers on a first substrate;
   forming a second stack of layers on a second substrate;
   prior to bonding the second stack of layers, forming a first hole in the first stack of layers;
   bonding the second stack to the first stack to form the memory cell stack;
   after bonding the second stack to the first stack, removing at least a portion of the second substrate;
   forming a second hole in the second stack, wherein the second hole is aligned with the first hole; and
   depositing a dielectric material in the aligned first and second holes to form a support pillar.

\* \* \* \* \*